United States Patent
Mason et al.

(10) Patent No.: US 10,865,101 B2
(45) Date of Patent: *Dec. 15, 2020

(54) DISCHARGE CIRCUITS, DEVICES AND METHODS

(71) Applicant: SKYWORKS SOLUTIONS, INC., Woburn, MA (US)

(72) Inventors: Jerod F. Mason, Bedford, MA (US); Dylan Charles Bartle, Arlington, MA (US); David Scott Whitefield, Andover, MA (US); David T. Petzold, Chelmsford, MA (US); Dogan Gunes, North Andover, MA (US); Paul T. Dicarlo, Marlborough, MA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/188,315

(22) Filed: Nov. 13, 2018

(65) Prior Publication Data

US 2019/0144266 A1 May 16, 2019

Related U.S. Application Data

(63) Continuation of application No. 14/685,554, filed on Apr. 13, 2015, now Pat. No. 10,125,011.

(Continued)

(51) Int. Cl.
*B81B 7/00* (2006.01)
*G01P 15/135* (2006.01)
(Continued)

(52) U.S. Cl.
CPC .............. *B81B 7/0022* (2013.01); *B81B 7/02* (2013.01); *B81C 1/00341* (2013.01);
(Continued)

(58) Field of Classification Search
CPC .................... B81B 7/0022; B81B 7/02; B81B 3/0064–0094; B81B 7/0009–0029;
(Continued)

(56) References Cited

U.S. PATENT DOCUMENTS 4,456,800 A * 6/1984 Holland .................. H01H 9/14
174/260
6,094,116 A 7/2000 Tai et al.
(Continued)

OTHER PUBLICATIONS

International Search Report and Written Opinion for corresponding PCT/US2015/025620 dated Jul. 30, 2015.

*Primary Examiner* — Nelson Garces
(74) *Attorney, Agent, or Firm* — Chang & Hale LLP

(57) ABSTRACT

Discharge circuits, devices and methods. In some embodiments, a MEMS device can include a substrate and an electromechanical assembly implemented on the substrate. The MEMS device can further include a discharge circuit implemented relative to the electromechanical assembly. The discharge circuit can be configured to provide a preferred arcing path during a discharge condition affecting the electromechanical assembly. The MEMS device can be, for example, a switching device, a capacitance device, a gyroscope sensor device, an accelerometer device, a surface acoustic wave (SAW) device, or a bulk acoustic wave (BAW) device. The discharge circuit can include a spark gap assembly having one or more spark gap elements configured to facilitate the preferred arcing path.

20 Claims, 13 Drawing Sheets

Related U.S. Application Data

(60) Provisional application No. 61/979,482, filed on Apr. 14, 2014.

(51) Int. Cl.
| | | |
|---|---|---|
| *B81B 7/02* | (2006.01) | |
| *B81C 1/00* | (2006.01) | |
| *H01H 59/00* | (2006.01) | |
| *G01C 19/56* | (2012.01) | |

(52) U.S. Cl.
CPC ....... *G01P 15/135* (2013.01); *H01H 59/0009* (2013.01); *B81B 2201/014* (2013.01); *B81B 2201/0235* (2013.01); *B81B 2201/0242* (2013.01); *B81B 2201/0271* (2013.01); *G01C 19/56* (2013.01)

(58) Field of Classification Search
CPC ................ B81B 7/0058; B81B 7/0064; B81B 2207/115; B81B 2201/01–018; B81B 2203/0118; B81B 2203/0181; B81B 2203/0109; B81B 2203/0307; B81B 2201/03–038; B81B 3/0086; H01H 59/0009; G01P 15/135; G01C 19/56; B81C 1/00007; B81C 1/00134–00198
See application file for complete search history.

(56) References Cited

U.S. PATENT DOCUMENTS

| | | | |
|---|---|---|---|
| 10,125,011 B2* | 11/2018 | Mason | B81B 7/02 |
| 2002/0151200 A1 | 10/2002 | Fauser et al. | |
| 2006/0002047 A1 | 1/2006 | Cheung et al. | |
| 2007/0057746 A1* | 3/2007 | Rubel | H01H 9/42 |
| | | | 333/105 |
| 2010/0187652 A1 | 7/2010 | Yang | |
| 2010/0263997 A1 | 10/2010 | Hilgers | |
| 2012/0286588 A1* | 11/2012 | Steeneken | H01H 59/0009 |
| | | | 307/115 |

\* cited by examiner

DISCHARGE CIRCUITS, DEVICES AND METHODS

CROSS-REFERENCE TO RELATED APPLICATION(S)

This application is a continuation of U.S. application Ser. No. 14/685,554 filed Apr. 13, 2015, entitled MEMS DEVICES HAVING DISCHARGE CIRCUITS, which claims priority to and the benefit of the filing date of U.S. Provisional Application No. 61/979,492 filed Apr. 14, 2014, entitled MEMS DEVICES HAVING DISCHARGE CIRCUITS, the benefits of the filing dates of which are hereby claimed and the disclosures of which are hereby expressly incorporated by reference herein in their entirety.

BACKGROUND

Field

The present disclosure relates to microelectromechanical systems (MEMS) devices having discharge circuits.

Description of the Related Art

Microelectromechanical systems devices, or MEMS devices, typically include miniaturized mechanical and electro-mechanical elements. Such MEMS devices can include moving elements controlled by a controller to provide desired functionalities. MEMS devices are sometimes referred to as microsystems technology devices or micro-machined devices.

SUMMARY

According to a number of implementations, the present disclosure relates to a microelectromechanical systems (MEMS) device that includes a substrate and an electromechanical assembly implemented on the substrate. The MEMS device further includes a discharge circuit implemented relative to the electromechanical assembly. The discharge circuit is configured to provide a preferred arcing path during a discharge condition affecting the electromechanical assembly.

In some embodiments, the MEMS device can be a switching device, a capacitance device, a gyroscope sensor device, an accelerometer device, a surface acoustic wave (SAW) device, or a bulk acoustic wave (BAW) device. In some embodiments, the MEMS device can be a switching device. The switching device can be a contact switching device. The discharge circuit can include a spark gap assembly having one or more spark gap elements configured to facilitate the preferred arcing path. The spark gap assembly can include a first conductor with one or more spark gap elements and a second conductor with one or more spark gap elements. Each of the one or more spark gap elements of the first and second conductors can include a shaped conductive feature. The shaped conductive feature can include a sharp feature to increase the likelihood of arcing. The one or more shaped conductive features of one of the first and second conductors can be laterally offset from the one or more shaped conductive features of the other conductor. The lateral offset of the shaped conductive features of the first and second conductors can be configured to provide the preferred arcing path as one conductor moves relative to the other conductor.

In some embodiments, each of the first and second conductors of the spark gap assembly can be located away from the electromechanical assembly. In some embodiments, one of the first and second conductors of the spark gap assembly can be located away from the electromechanical assembly, and the other conductor can be a part of the electromechanical assembly. In some embodiments, each of the first and second conductors of the spark gap assembly can be a part of the electromechanical assembly.

In some embodiments, the contact switching device can includes a movable first electrode and a stationary second electrode as parts of the electromechanical assembly. The movable first electrode can include a beam having a contact pad. The beam can be configured to be in a first state in which the contact pad is disengaged from the second electrode, and in a second state in which the contact pad is engaged with the second electrode. The contact switch device can further include a gate configured to provide an electrostatic force to the beam to thereby allow the beam to be in the first state or the second state. The spark gap assembly can be configured such that a discharging arc through the preferred arcing path occurs at a first potential difference between the first and second electrodes, with the first potential difference being lower than a potential difference needed to trigger an arc through the contact pad when the beam is in the first state. The spark gap assembly can be further configured so that the first potential difference is lower than a lowest potential difference needed to trigger an arc through the contact pad in a range of motion of the contact pad relative to the second electrode. The spark gap assembly can be configured to provide discharge protection during hot switching operations as well as cold switching operations.

In some embodiments, the contact switching device can include a self-activation functionality, where the self-activation can result from a sufficient voltage difference between the beam and the gate. The self-activation can result in the contact pad engaging the second electrode. The gate can be coupled to ground such that the self-activation results in charge associated with the sufficient voltage difference between the beam and the gate to be dissipated to the ground.

In some embodiments, the discharge condition can include an electrostatic discharge (ESD) event. The contact switching device can be an electrostatic discharge (ESD) protection MEMS device. The ESD protection MEMS device can be configured to have to have either or both functionalities of a faster switching speed and actuation at a lower voltage than other MEMS devices in a circuit.

In some teachings, the present disclosure relates to a method for fabricating a microelectromechanical systems (MEMS) device. The method includes providing a substrate and forming an electromechanical assembly on the substrate. The method further includes forming a discharge circuit relative to the electromechanical assembly. The discharge circuit is configured to provide a preferred arcing path during a discharge condition affecting the electromechanical assembly.

In a number of implementations, the present disclosure relates to a radio-frequency (RF) module that includes a packaging substrate configured to receive a plurality of components, and an RF MEMS device implemented on the packaging substrate. The RF MEMS device includes an electromechanical assembly, and a discharge circuit implemented relative to the electromechanical assembly. The discharge circuit is configured to provide a preferred arcing path during a discharge condition affecting the electromechanical assembly.

In some embodiments, the RF MEMS device can be, for example, a capacitor or an RF switch. In some embodiments, the RF module can be an antenna switch module (ASM).

In a number of teachings, the present disclosure relates to a method for fabricating a radio-frequency (RF) module. The method includes providing a packaging substrate configured to receive a plurality of components. The module further includes mounting or forming an RF MEMS device on the packaging substrate. The RF MEMS device includes an electromechanical assembly, and a discharge circuit implemented relative to the electromechanical assembly. The discharge circuit is configured to provide a preferred arcing path during a discharge condition affecting the electromechanical assembly.

According to a number of implementations, the present disclosure relates to a radio-frequency (RF) device that includes a receiver configured to process an RF signal, and a front-end module (FEM) in communication with the receiver. The FEM includes a switching circuit configured to route the RF signal and having an RF MEMS device. The RF MEMS device includes an electromechanical assembly, and a discharge circuit implemented relative to the electromechanical assembly. The discharge circuit is configured to provide a preferred arcing path during a discharge condition affecting the electromechanical assembly. The RF device further includes an antenna in communication with the FEM. The antenna is configured to receive the RF signal.

In some embodiments, the RF device can be a wireless device such as a cellular phone.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Disclosed are various examples related to microelectromechanical systems (MEMS) devices and how such devices can include a discharge circuit configured to, for example, provide protection against conditions such as electrostatic discharge (ESD). Although various examples are described in the context of MEMS, it will be understood that one or more features of the present disclosure can also be utilized in other electromechanical systems having dimensions larger or smaller (e.g., NEMS) than typical MEMS dimensions.

Figure 1:
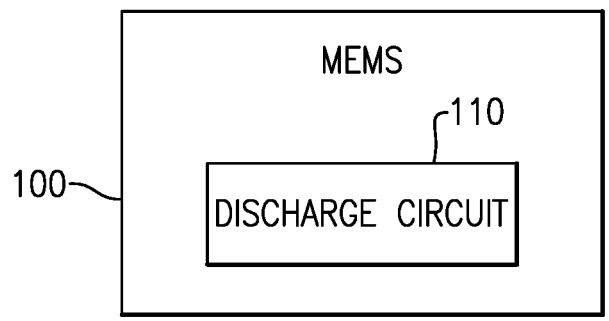
FIG. 1 shows a block diagram of a microelectromechanical systems (MEMS) device having a discharge circuit.

FIG. 1 shows a block diagram of a MEMS device 100 having a discharge circuit 110. In some embodiments, such a discharge circuit can be implemented substantially within the MEMS boundary and/or volume, and be configured to provide an electrical discharge path under certain conditions (e.g., ESD event).

As is generally understood, a MEMS device typically includes an electromechanical assembly implemented on a substrate. Such an electromechanical assembly can be configured to yield mechanical changes based on electrical inputs; and such mechanical changes can yield changes in electrical properties of the MEMS device. Contact switches and capacitors are examples of devices that can be implemented in MEMS form factors. Although various examples are described herein in the contexts of such switches and capacitors, it will be understood that one or more features of the present disclosure can also be utilized in other MEMS devices.

Figure 2A:
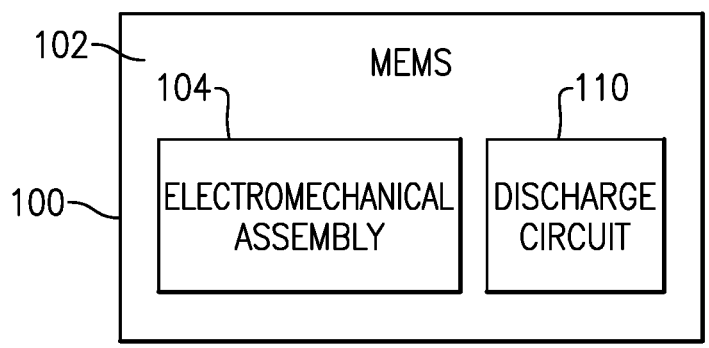
FIGS. 2A-2C show examples of how a discharge circuit can be implemented relative to an electromechanical assembly on a MEMS device.
Figure 2B:
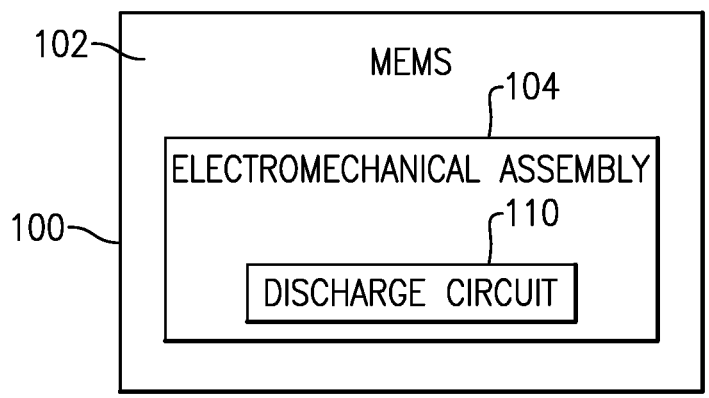
Figure 2C:
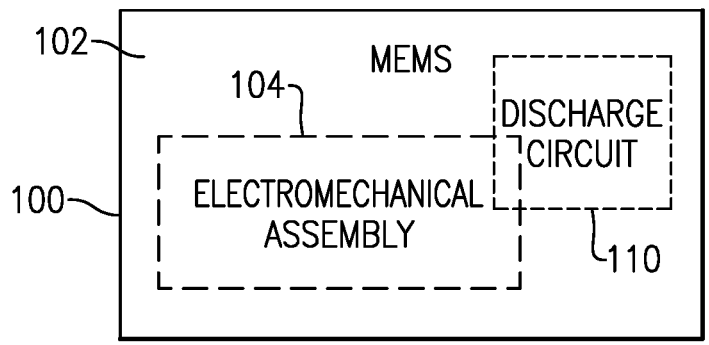

FIGS. 2A-2C show examples of how a discharge circuit 110 can be implemented relative to an electromechanical assembly 104 on a MEMS device 100. FIG. 2A shows that in some embodiments, a MEMS device 100 can include an electromechanical assembly 104 implemented on a substrate 102. A discharge circuit 110 having one or more features as described herein can be implemented separately from the electromechanical assembly 104. Examples related to such a configuration are described herein in greater detail.

FIG. 2B shows that in some embodiments, a MEMS device 100 can include an electromechanical assembly 104 implemented on a substrate 102. A discharge circuit 110 having one or more features as described herein can be implemented as a part of the electromechanical assembly 104. Examples related to such a configuration are described herein in greater detail.

FIG. 2C shows that in some embodiments, a MEMS device 100 can include an electromechanical assembly 104 implemented on a substrate 102. A discharge circuit 110 having one or more features as described herein can be implemented partially as a part of the electromechanical assembly 104, and partially separately from the electromechanical assembly 104. Examples related to such a configuration are described herein in greater detail.

In some embodiments, some or all of the different configurations of FIGS. 2A-2C can be implemented in combination.

As described herein, discharge circuits as described herein can be desirable in MEMS devices for a number of reasons. For example, protecting MEMS devices and circuits from ESD has been an issue in various applications. These devices are typically highly sensitive to electrical overstress, which can cause immediate failures and/or lead to long term reliability issues. An electrical overstress from ESD events can damage, for example, contacts, dielectrics and/or substrates associated with MEMS devices.

Figure 3:
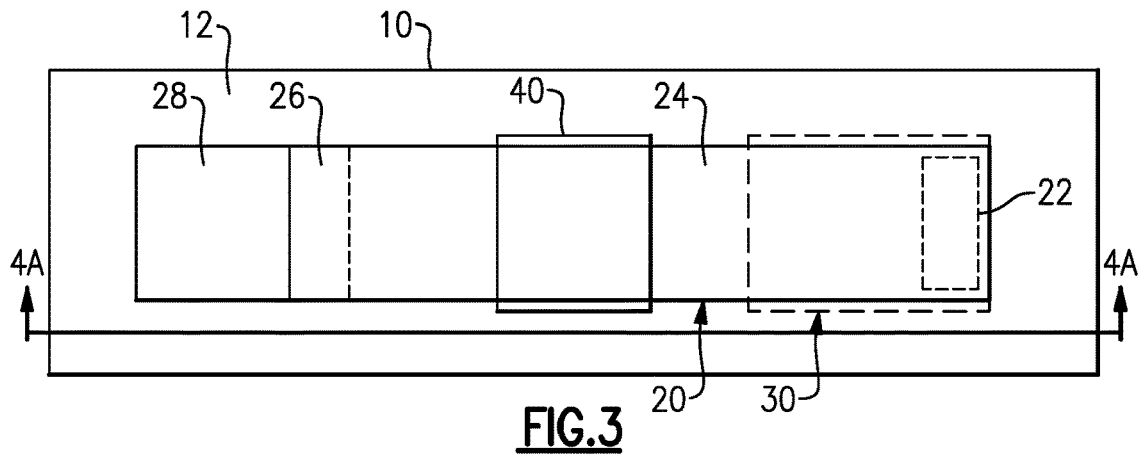
FIG. 3 shows a plan view of an example MEMS contact switch without a discharge circuit.
Figure 4A:
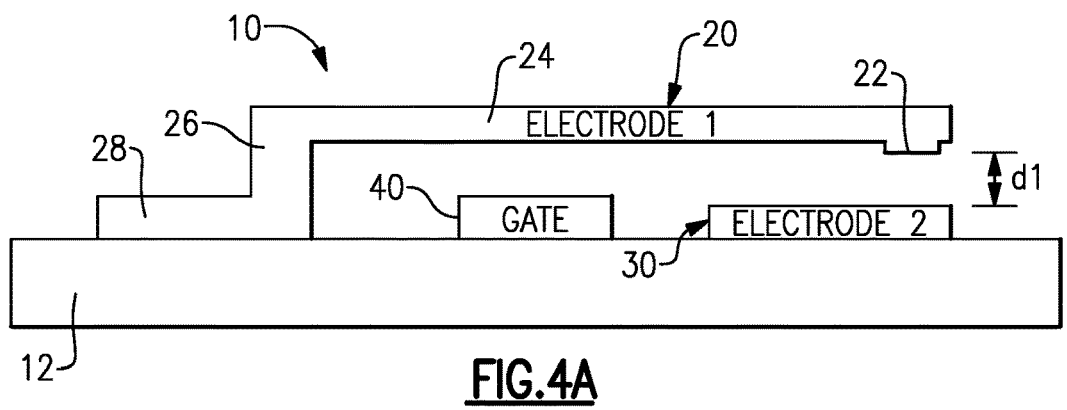
FIGS. 4A-4C show side views of the switch of FIG. 3 in various stages of activation.
Figure 4B:
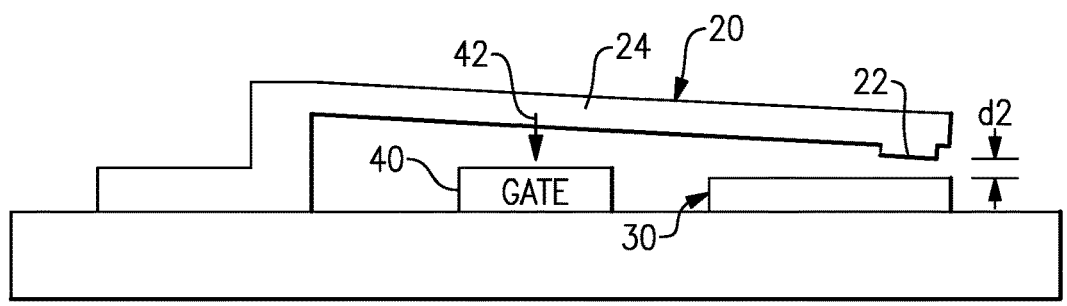
Figure 4C:
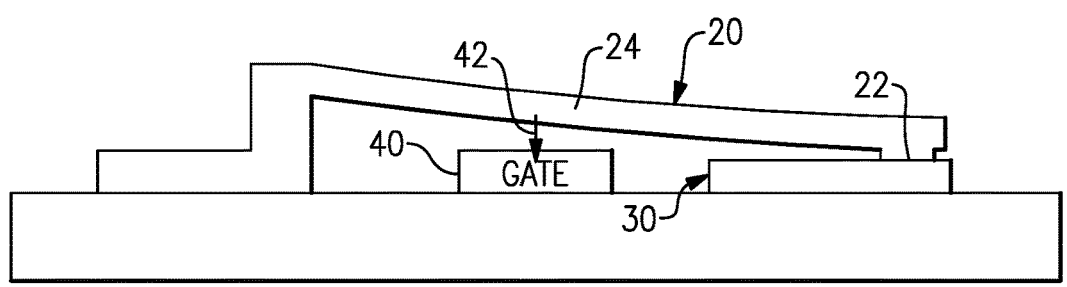

FIG. 3 shows a plan view of an example MEMS contact switch 10 without a discharge circuit, and FIGS. 4A-4C show side views of the switch 10 of FIG. 3 in various stages of activation. In the example MEMS switch 10, a first electrode 20 is shown to be implemented as a beam 24 supported on a post 26 which is in turn mounted on a substrate 12 through a base 28. The first electrode 20 is shown to include a contact pad 22 formed at or near the end opposite from the post 26. When the switch 10 is in an OFF state (FIG. 4A), the beam 24 can be in its relaxed state such that the contact pad 22 is separated from a second electrode 30 by a distance d1. When the switch 10 is in an ON state (FIG. 4C), the beam 24 can be in its flexed state such that the contact pad 22 is touching the second electrode 30 so as to form an electrical connection between the first electrode 20 and the second electrode 30.

In the example MEMS switch 10, transition between the foregoing OFF and ON states can be effectuated by a gate 40 configured to provide electrostatic actuation. For example, when an actuation signal is applied to the gate 40, the gate 40 can apply an attractive electrostatic force (arrow 42) on the beam 24 to thereby pull on the beam 24. Accordingly, the contact pad 22 of the first electrode 20 moves closer to the second electrode 30 (e.g., in an intermediate stage in FIG. 4B with a gap distance of d2), until the two physically touch to close the circuit between the first and second electrodes 20, 30. When the actuation signal is removed from the gate 40, the attractive force 42 is removed. Accordingly, the beam 24 can return to its relaxed state of FIG. 4A.

The close proximity of the elements (e.g., the contact pad 22 and the second electrode 30 of FIGS. 3 and 4) in a MEMS device can allow electrical arcing between nearby elements during an ESD event. Such an arcing can damage the MEMS device. For example, contact areas on the contact pad 22 and the second electrode 30 of the switch 10 are relatively close to each other, especially during a transition state (e.g., FIG. 4B). Accordingly, arcing can damage such contact areas and degrade the performance of the switch, or even worse, make the switch un-usable.

Figure 5:
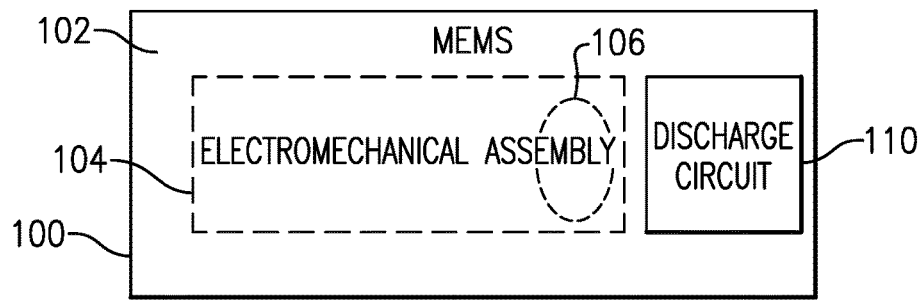
FIG. 5 shows a more specific example of the configuration of FIG. 2A, where a discharge circuit can be implemented to be generally separate from an electromechanical assembly.

FIGS. 5-15 show various examples related to discharge circuits associated with MEMS switches. FIGS. 5 and 6 show examples where a discharge circuit can be generally separate from an electromechanical assembly. FIGS. 7-10 show examples where a discharge circuit can be considered to be a part of an electromechanical assembly. FIGS. 11-15 show examples where a discharge circuit can be considered to be implemented partially as a part of an electromechanical assembly and partially separate from the electromechanical assembly.

Although the examples of FIGS. 5-15 are described in the context of beam-type MEMS switches, it will be understood that one or more features associated with the discharge circuits can also be implemented in other types of MEMS switches. Further, in the examples of FIGS. 5-15, switching functionality is described in the context of first and second electrodes being coupled to input and output (or output and input). However, it will be understood that one or more features associated with the discharge circuits can also be implemented with other types of switching functionalities. For example, a contact pad on a beam can contact two ends of otherwise separate input and output terminals to thereby close the circuit between the input and output terminals.

FIG. 5 shows a more specific example of the configuration of FIG. 2A, where a discharge circuit 110 can be implemented to be generally separate from an electromechanical assembly 104. In FIG. 5, the discharge circuit 110 of a MEMS device 100 is shown to be implemented on a substrate 102 at a location that is near a portion 106 (of the electromechanical assembly 104) that is susceptible to ESD events. In the context of a beam-type MEMS device 100 of FIGS. 6A and 6B, such a portion susceptible to ESD events can include a contact pad 122 and the corresponding contact surface on an electrode 130.

Figure 6A:
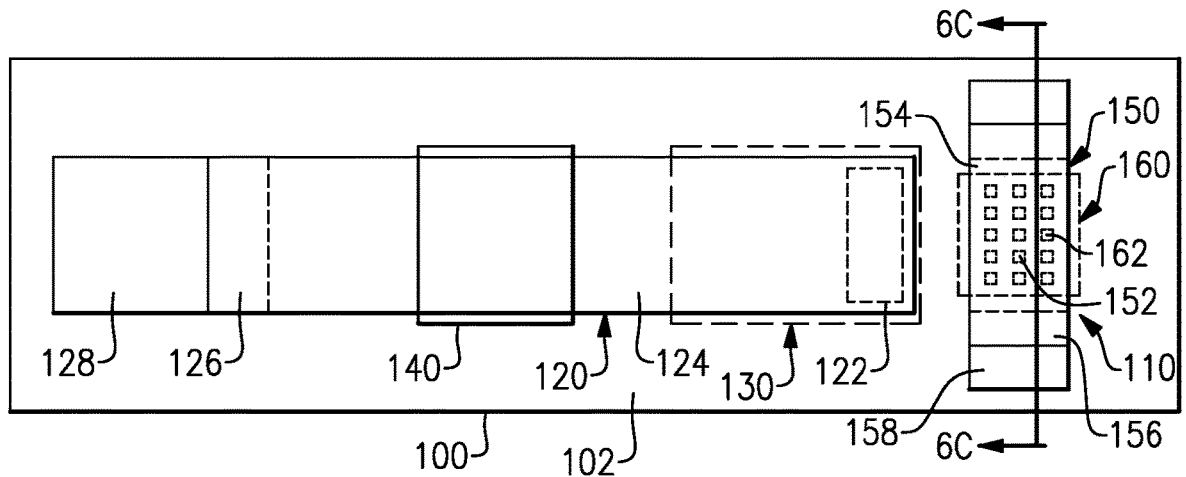
FIGS. 6A and 6B show more specific examples of the configuration of FIG. 5.
Figure 6B:
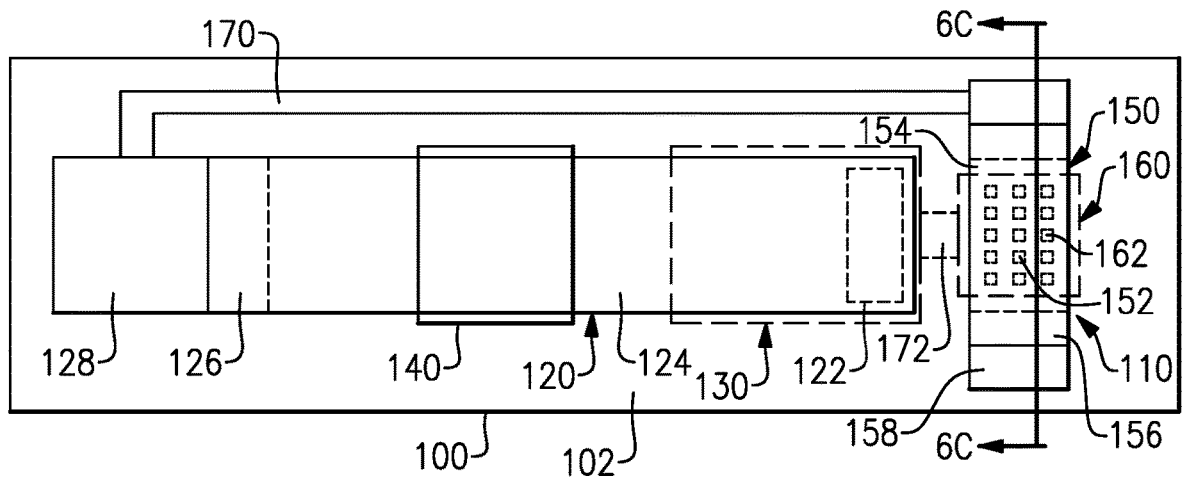

In FIGS. 6A and 6B, switching operations between the contact pad 122 of a first electrode 120 and the second electrode 130 can be achieved in manners similar to the example of FIGS. 4A-4C. More particularly, the first electrode 120 can be implemented as a beam 124 supported on a post 126 which is in turn mounted on a substrate 102 through a base 128. The contact pad 122 is shown to be positioned at or near the end of the beam 124 opposite from the post 126. When the switch 100 is in an OFF state, the beam 124 can be in its relaxed state such that the contact pad 122 is separated from the second electrode 130. When the switch 100 is in an ON state, the beam 124 can be in its flexed state such that the contact pad 122 is touching the second electrode 130 so as to form an electrical connection between the first electrode 120 and the second electrode 130.

The foregoing transition between the OFF and ON states can be effectuated by a gate 140 configured to provide electrostatic actuation. For example, when an actuation signal is applied to the gate 140, the gate 140 can apply an attractive electrostatic force on the beam 124 to thereby pull on the beam 124. Accordingly, the contact pad 122 of the first electrode 120 can contact the second electrode 130 to close the circuit between the first and second electrodes 120, 130. When the actuation signal is removed from the gate 140, the attractive force is removed so as to result in the beam returning to its relaxed state and thereby separating the contact pad 122 from the second electrode 130 and thereby opening the circuit between the first and second electrodes 120, 130.

In FIGS. 6A and 6B, each of the MEMS devices 100 is shown to include a discharge circuit 110 positioned near the contact pad (122) end of the beam 124. In FIG. 6A, the discharge circuit 110 can be generally isolated from the electromechanical assembly which includes the first electrode 120 and the second electrode 130. Such a configuration can be implemented if it is desirable to have a discharge such as an ESD be routed to a node other than those connected to the first electrode 120 and the second electrode 130. For example, it may be desirable to have a discharge be shunted to ground away from the first and second electrodes 120, 130.

In FIG. 6B, the discharge circuit 110 can be coupled to the first electrode 120 (through a path 170) and the second electrode 130 (through a path 172), essentially providing a discharge path that is electrically parallel with the assembly of the first and second electrodes 120, 130. Such a configuration can be implemented if it is desirable to have a discharge path, for an event such as an ESD, bypass sensitive portions of the first electrode 120 and the second electrode 130. For example, it may be desirable to have a discharge be routed between the first electrode 120 and the second electrode 130, but not through the contact pad 122. As described herein, the discharge circuit 110 can be configured to allow such a discharge to occur away from the contact pad 122.

Figure 6C:
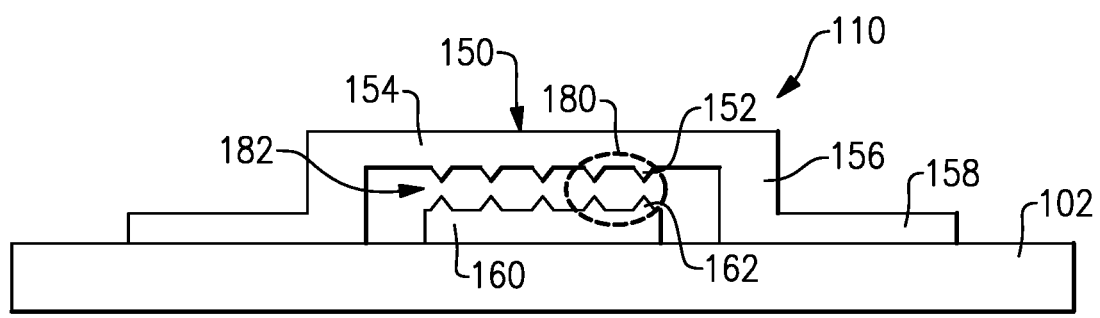
FIG. 6C shows a sectional view of a discharge circuit of the examples of FIGS. 6A and 6B.
Figure 6D:
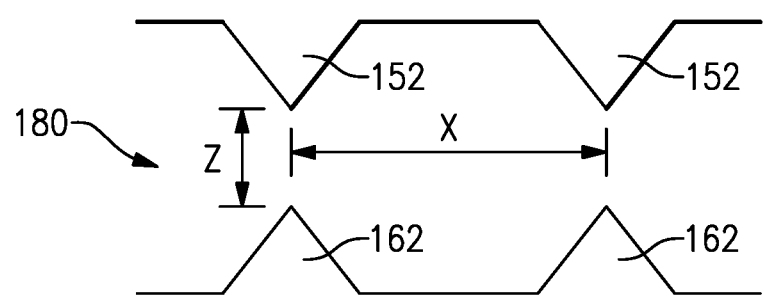
FIG. 6D shows a more detailed view of a spark gap assembly of the discharge circuit of FIG. 6C.
Figure 7A:
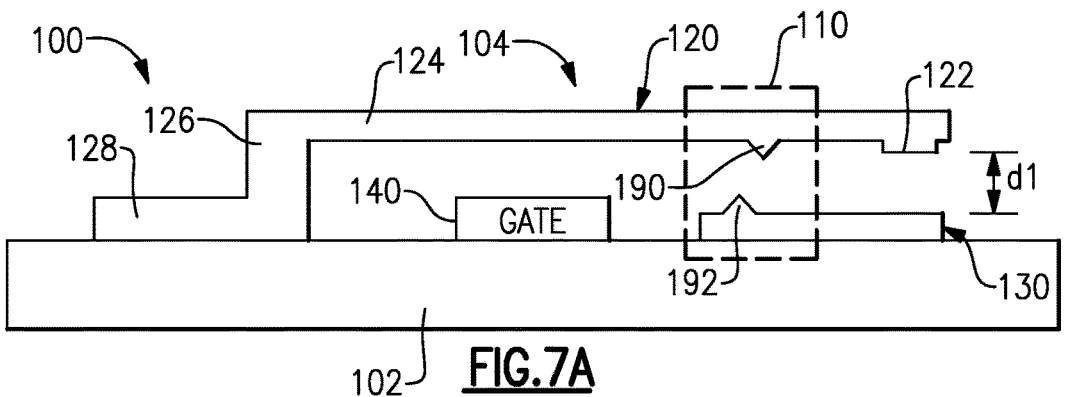
FIGS. 7A-C side views of a MEMS device having a discharge circuit integrated into its electromechanical assembly.
Figure 7B:
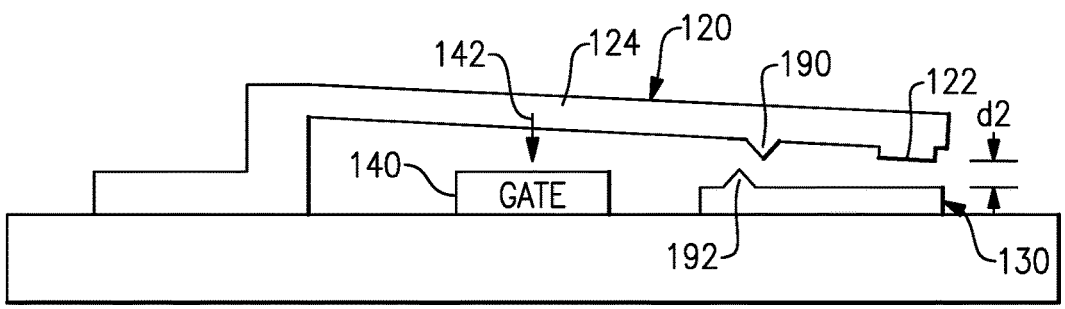
Figure 7C:
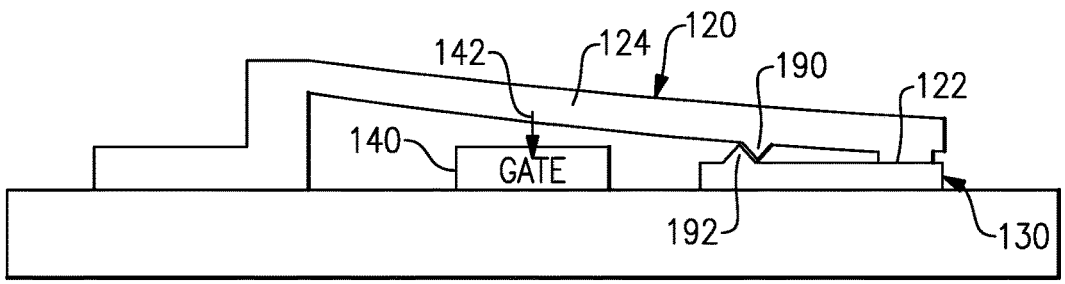

As shown in FIGS. 6A-6C, the example discharge circuit 110 can include a first conductor 150 and a second conductor 160 configured to provide an arcing path that is more preferable than arcing paths between the first and second electrodes 120, 130. For example, a spark gap configuration 182 can be provided where either or both of the first and second conductors 150, 160 includes one or more shaped conductive features that lower the potential difference needed to cause arcing.

In the example shown, each conductor (150 or 160) includes a plurality of sharp conductive protrusions (152 for the first conductor 150, 162 for the second conductor 160) that are generally aligned with the counterpart protrusions of the other conductor (160 or 150). As better shown in FIG. 6D, design parameters such as dimensions of the sharp protrusions (152, 162), gap distance (z) between two counterpart protrusions, and spacing (x) between the neighboring protrusions can be selected to provide desired arcing properties.

As shown in FIG. 6C, the foregoing spark gap configuration 182 can be implemented by positioning the first conductor 150 at a distance from the second conductor 160. If the second conductor 160 is positioned on the substrate 102, the first conductor 150 can be positioned in such a manner by posts 156 and their respective bases 158.

The discharge circuit 110 configured in the foregoing manner can provide a structure that results in arcing at lower potential difference levels than that of the electromechanical assembly so that the charge of an ESD event can be dissipated appropriately with little or no damage to the electromechanical assembly. Design of the spark gap configuration 182 in FIGS. 6A-6C can be relatively easier due to the static nature of the discharge circuit 110 where the protrusions 152, 162 of the first and second conductors 150, 160 generally do not move relative to each other. Accordingly, one set of protrusions (152 or 162) can remain at a fixed position relative to the other set of protrusions (162 or 152). For example, the sharp points of the protrusions 152 can be positioned and remain substantially aligned with the sharp points of the protrusions 162.

In some embodiments, some or all of a discharge circuit can be integrated into an electromechanical assembly. For example, FIGS. 7A-C and 8 show side and plan views of a MEMS device 100 having a discharge circuit 110 integrated into its electromechanical assembly 104. The discharge circuit 110 is shown to include a spark gap configuration between one or more shaped conductive features 190 on an underside of a first electrode 120 and one or more shaped conductive features 192 on an upper side of a second electrode 130. The conductive features 190, 192 are shown to be positioned so as to provide one or more arcing paths at location(s) away from the switching contact area (e.g., between a contact pad 122 and the corresponding area on the second electrode 130). Accordingly, in an ESD event, such an arcing through the spark gap can prevent or reduce damage to the switching contact area.

Figure 8:
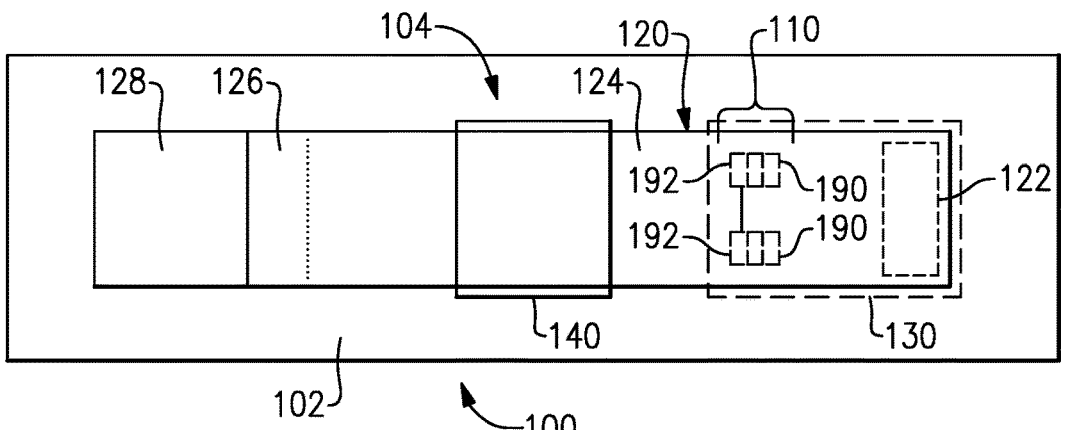
FIG. 8 show a plan view of the MEMS device of FIGS. 7A-7C.

In the example of FIGS. 7 and 8, the configuration of the first and second electrodes 120, 130 can be similar to those of FIGS. 6A and 6B and FIGS. 3 and 4, other than the presence of the integrated discharge circuit 119 in FIGS. 7 and 8. Accordingly, switching operations actuated by a gate 140 can be performed in similar manners.

In the example discharge circuit 110 of FIGS. 6A-6D, the spark gap configuration includes the spark gap elements (e.g., shaped conductor features) arranged in a fixed manner (e.g., with the sharp tips aligned). In the example of FIGS. 7 and 8, however, relative position of the spark elements (190 for the first electrode 120, and 192 for the second electrode 130) does not remain constant during a switching operation due to the movement of the beam 124. Accordingly, in some embodiments, the spark elements 190, 192 can be arranged so as to provide a preferred arcing path during some or all of the entire movement range of the beam 124 without making physical contact.

In some embodiments, and as shown in FIGS. 7 and 8, the foregoing arrangement of the spark gap elements 190, 192 can be achieved by providing a lateral offset between the upper spark gap elements 190 and the lower spark gap elements 192. Such an arrangement can allow the beam 124 to move in its full range of motion while providing desired distances between the spark gap elements 190, 192 without physical contact. Such a spark gap configuration can provide a preferred arcing path over an arcing path involving the contact pad 122 during some or all of the entire movement range of the beam 124.

The foregoing configuration (where arcing is more likely through the preferred arcing path) can be particularly useful for providing discharge protection during hot switching operations. In a hot switching operation, a signal being switched ON or OFF is present on one of the electrodes. When the contact pad 122 is closer to the second electrode 130 (e.g., FIG. 7B when it moves towards the second electrode 130 to close the switch, or when it moves away from the second electrode upon opening of the switch), arcing is more likely due to the smaller gap. Without the discharge circuit 110, arcing resulting from the signal itself can occur; and such arcing during hot switching operation can result in damage to the contact pad 122 and/or the second electrode 130. As described herein, the discharge circuit 110 can be configured to provide a preferred arcing path, even when the contact pad 122 is very close to the second electrode 130.

Figure 9:
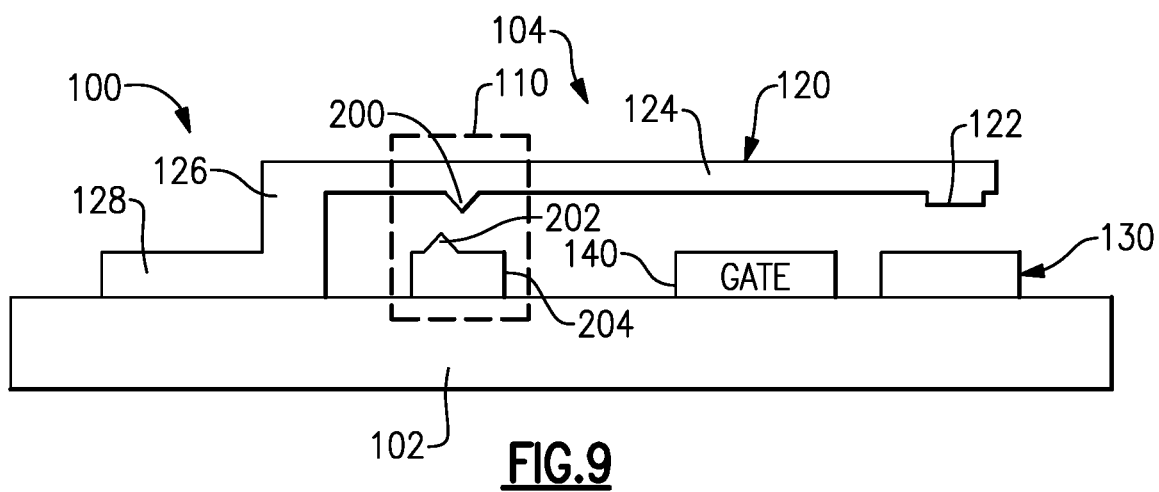
FIG. 9 shows a side view of a MEMS device having a discharge circuit that is similar to the example of FIGS. 7A-7C, but in which the discharge circuit is moved further away from a contact pad.
Figure 10:
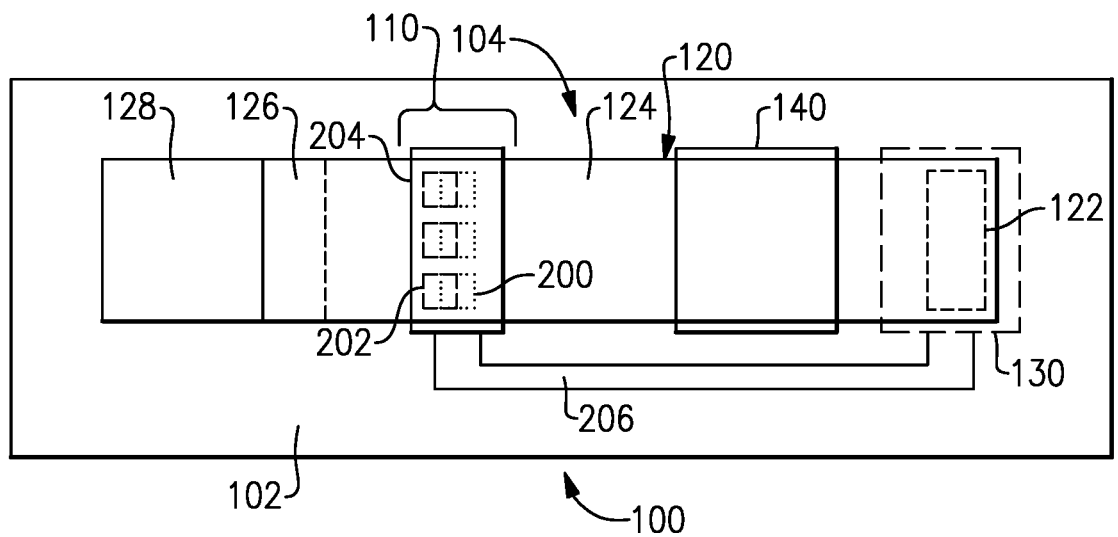
FIG. 10 shows a plan view of the MEMS device of FIG. 9.

FIGS. 9 and 10 show side and plan views of a MEMS device 100 having a discharge circuit 110 that is similar to the example of FIGS. 7 and 8. However, in the MEMS device 100 of FIGS. 9 and 10, the discharge circuit 110 is shown to be moved further away from the contact pad 122 and on the other side of the gate 140. To accommodate such a configuration, a conductor structure 204 can be provided to include one or more lower spark gap elements 202 (e.g., shaped conductive features). Such lower spark gap elements are shown to be arranged in a laterally offset manner relative to one or more upper spark gap elements 200 (e.g., shaped conductive features) formed on the underside of the beam 124, to accommodate the movement of the beam 124.

Similar to the example of FIGS. 7 and 8, the foregoing spark gap between the upper and lower spark gap elements 200, 202 can provide a preferred arcing path in hot or cold switching operations. The discharge circuit 110 of FIGS. 9 and 10 being further away from the contact pad 122 can be useful in, for example, applications where a signal is present in the first electrode 120 and where arcing during hot switching operation is a concern. The closer proximity of the discharge circuit 110 to the source of the signal (e.g., the base 128), combined with its spark gap configuration providing a preferred arcing path, can make it more likely that arcing due to the signal itself will be routed through the discharge circuit 110.

In some embodiments, and as shown in FIG. 10, the lower spark gap elements 202 are shown to be electrically connected to the second electrode 130 through the conductor structure 204 and a conductive path 206. Accordingly, the discharge circuit 110 can be considered to provide a parallel and more preferred arcing path than an arcing path involving the contact pad 122. As described herein, the discharge circuit 110 can be connected in other manners to provide different routing options. For example, the lower spark gap elements 202 can be connected to ground.

Figure 11:
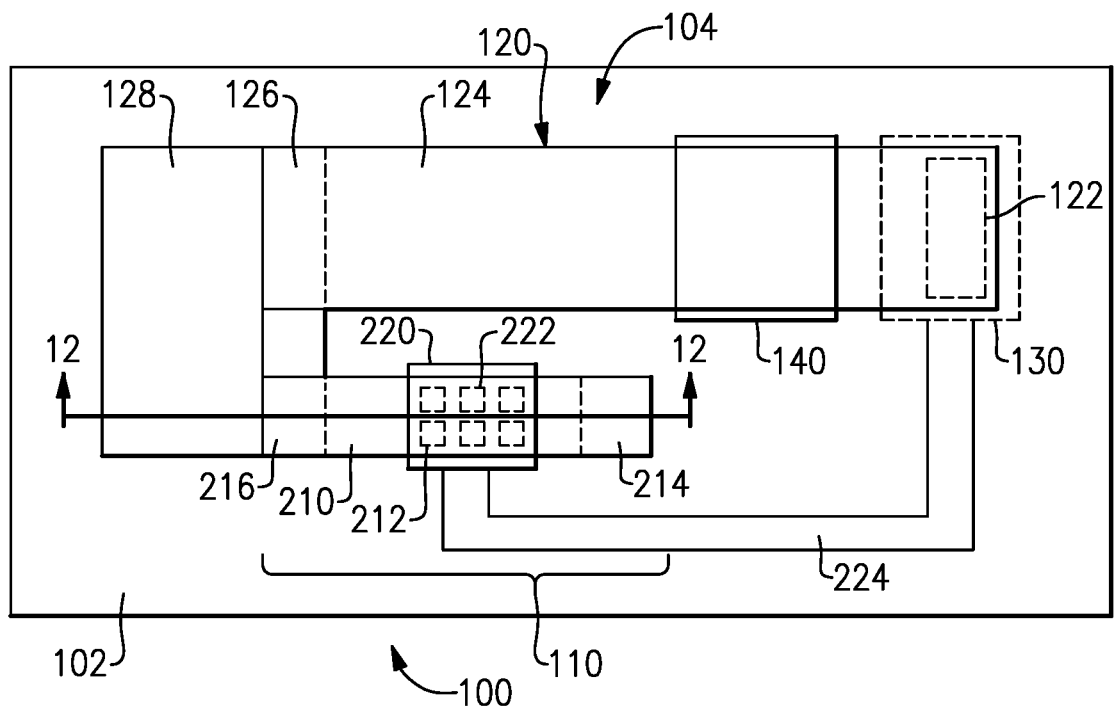
FIG. 11 shows a plan view of a MEMS device having a discharge circuit that is coupled to an electrode but separate from a beam.
Figure 12:
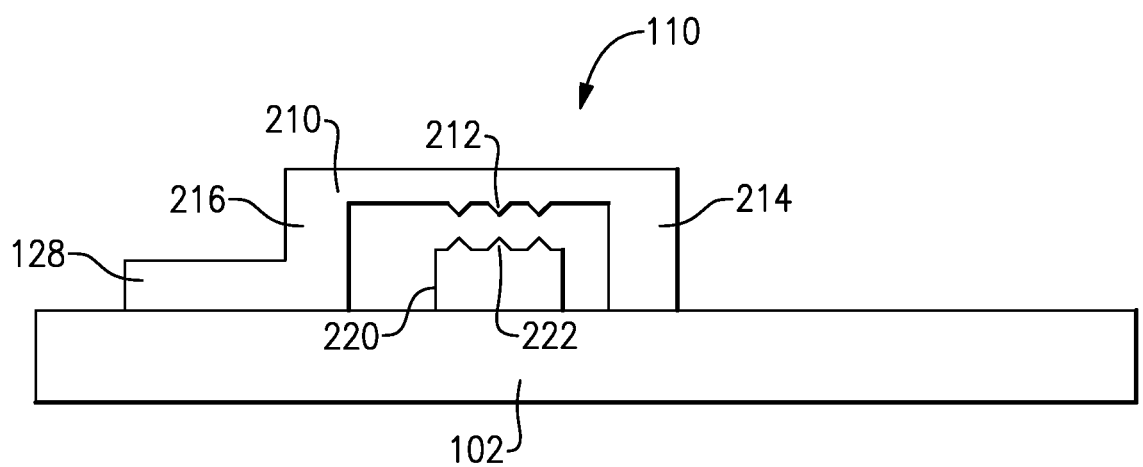
FIG. 12 shows a side view of the discharge circuit of FIG. 11.

FIG. 11 shows a plan view of a MEMS device 100 having a discharge circuit 110 that is coupled to the first electrode 120 but separate from the beam 124. FIG. 12 shows a side view of the discharge circuit 110.

In FIGS. 11 and 12, the electromechanical assembly 104 can be configured for switching operations in similar manners as the other beam-actuated switch examples described herein. The discharge circuit 110 is shown to include a spark gap configuration between one or more upper spark gap elements 212 (e.g., shaped conductive features) and one or more lower spark gap elements 222 (e.g., shaped conductive features). The upper spark gap elements 212 can be formed on the underside of a conductor 210 supported by posts 214, 216. The post 216 is shown to be connected to the base 128 of the electromechanical assembly 104. The lower spark elements 222 can be formed on the upper surface of a conductor structure 220. Since the spark gap elements 212, 222 generally do not move, they can be positioned relative to each other to provide a desired arcing property.

In the example of FIGS. 11 and 12, the lower spark gap elements 222 are shown to be electrically connected to the second electrode 130 through the conductive structure 220 and a conductive path 224. Accordingly, the discharge circuit 110 can be considered to provide a parallel and more preferred arcing path than an arcing path involving the contact pad 122. As described herein, the discharge circuit 110 can be connected in other manners to provide different routing options. For example, the lower spark gap elements 222 can be connected to ground.

The example of FIGS. 11 and 12 can provide similar discharge functionality as the example of FIG. 6, utilizing a fixed spark gap configuration. In the example of FIGS. 11 and 12, the discharge circuit 110 being further away from the contact pad 122 and being coupled more directly to the first electrode 120 can be advantageous in applications where a signal is input through the first electrode 120. The discharge circuit 110 can be configured to provide discharge protection in hot or cold switching operations. For the hot switching operation, the spark gap between the elements 212, 222 can be configured appropriately to provide a preferred arcing path for some or all of the movement range of the contact pad 122.

In the various examples described in reference to FIGS. 6-12, the spark gap configurations include spark gap elements that form vertical gaps similar to the vertical arrangement of the first and second electrodes. Other configurations of spark gaps can also be implemented.

Figure 13:
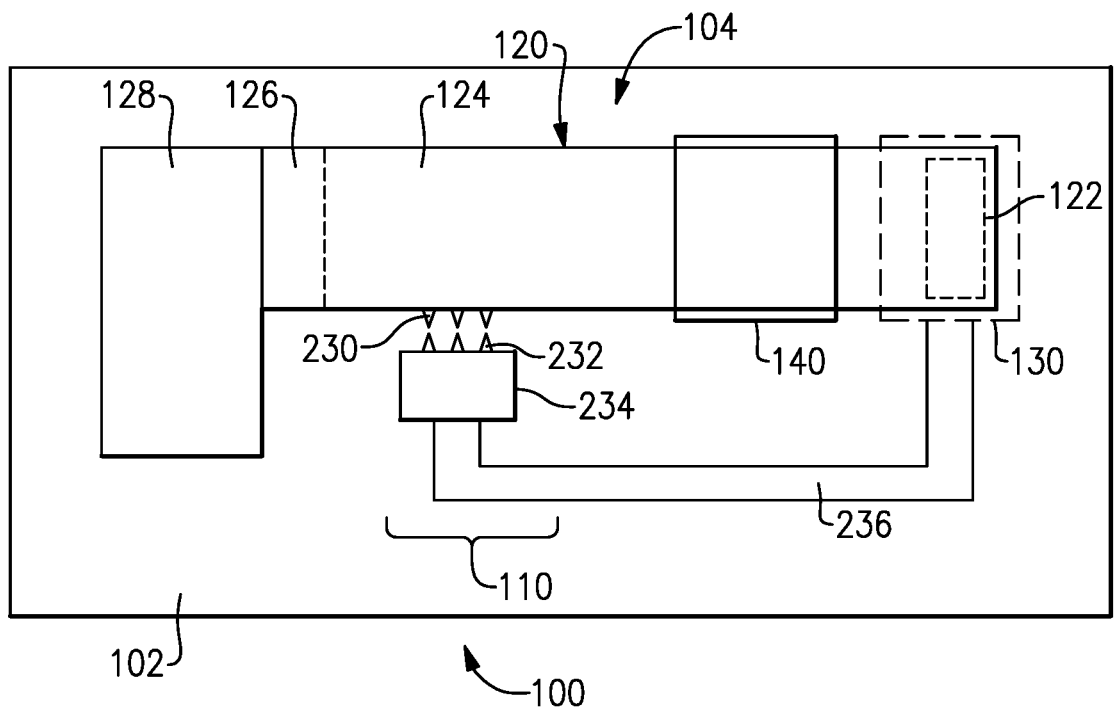
FIG. 13 shows that in some embodiments, a discharge circuit can include one or more spark gap elements implemented on a side of a beam, and one or more spark gap elements implemented on a side of a conductor structure.
Figure 14:
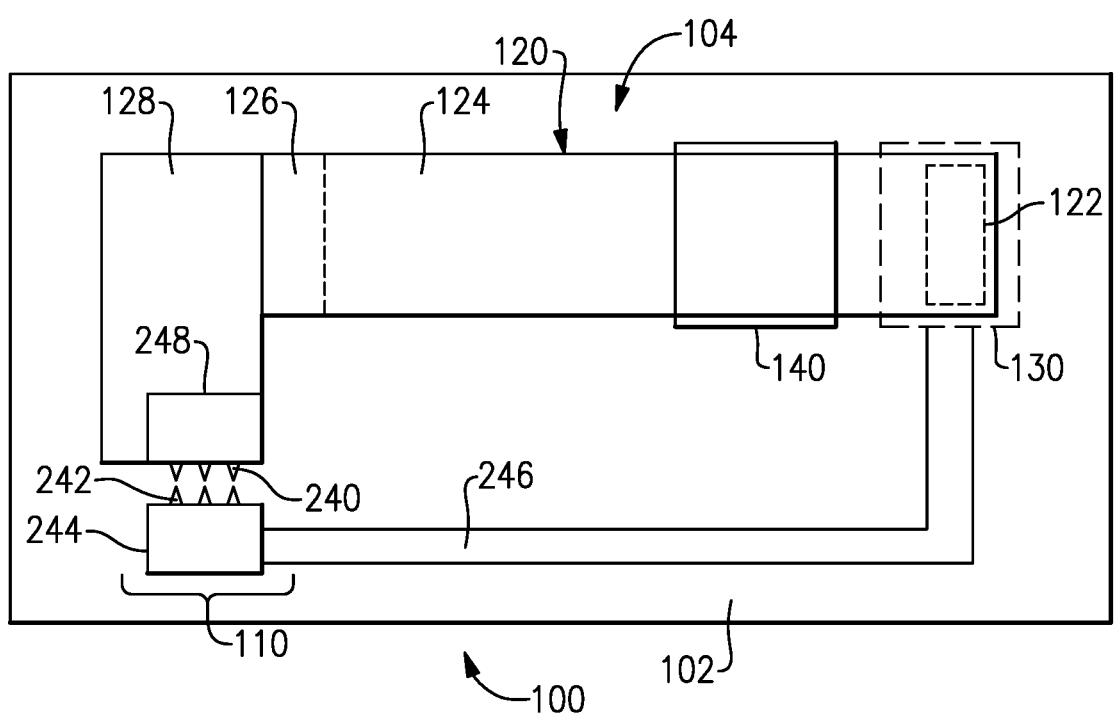
FIG. 14 shows that in some embodiments, a discharge circuit can include a spark gap configuration between two generally fixed parts.
Figure 15:
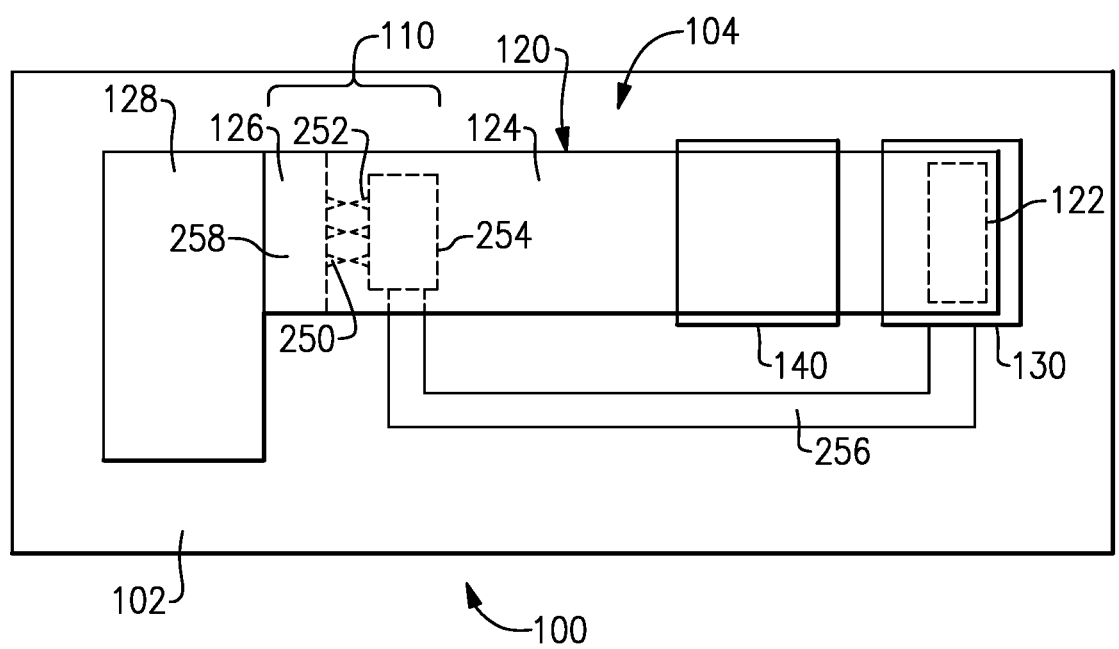
FIG. 15 shows another example in which a discharge circuit can include a spark gap configuration between two generally fixed parts.

For example, FIGS. 13-15 show discharge circuits 110 having lateral spark gap configurations. In each of the examples of FIGS. 13-15, the electromechanical assembly 104 can be configured for switching operations in similar manners as the other beam-actuated switch examples described herein.

In the example of FIG. 13, the discharge circuit 110 is shown to include a spark gap configuration between one or more spark gap elements 230 (e.g., shaped conductive features) on a side of the beam 124 and one or more spark gap elements 232 (e.g., shaped conductive features) on a side of a conductor structure 234. In such a configuration, either or both of the spark gap elements 230, 232 can be configured to accommodate the movements of the beam during switching operations so as to provide a preferred arcing path over an arcing path involving the contact pad, for some or all of the movement range.

In the example of FIG. 13, the spark gap elements 232 are shown to be electrically connected to the second electrode 130 through the conductive structure 234 and a conductive path 236. Accordingly, the discharge circuit 110 can be considered to provide a parallel and more preferred arcing path than the arcing path involving the contact pad 122. As described herein, the discharge circuit 110 can be connected in other manners to provide different routing options. For example, the spark gap elements 232 can be connected to ground.

In some applications, it may be desirable to have opposing spark gap elements remain generally fixed relative to each other during movements of the beam of an electromechanical assembly 104. In such a configuration, the spark gap elements can remain generally fixed during the movements of the beam. Accordingly, the spark gap elements can be configured to provide a preferred arcing path over an arcing path involving the contact pad, for some or all of the movement range of the beam. FIGS. 14 and 15 show non-limiting examples of such a configuration.

In the example of FIG. 14, the discharge circuit 110 includes a spark gap configuration between two generally fixed parts. For example, the spark gap configuration of the discharge circuit 110 is shown to be between one or more spark gap elements 240 (e.g., shaped conductive features) on a side of a base 128 of the first electrode 120 and one or more spark gap elements 242 (e.g., shaped conductive features) on a side of a conductor structure 244. A conductor structure 248 can be implemented on the base 128 to elevate the spark gap elements 240 to a level appropriate for the spark gap elements 242.

In the example of FIG. 14, the spark gap elements 242 are shown to be electrically connected to the second electrode 130 through the conductive structure 244 and a conductive path 246. Accordingly, the discharge circuit 110 can be considered to provide a parallel and more preferred arcing path than the arcing path involving the contact pad 122. As described herein, the discharge circuit 110 can be connected in other manners to provide different routing options. For example, the spark gap elements 242 can be connected to ground.

In the example of FIG. 15, the discharge circuit 110 is similar to the example of FIG. 14, in that the spark gap configuration is between two generally fixed parts. For example, the spark gap configuration of the discharge circuit 110 is shown to be between one or more spark gap elements 250 (e.g., shaped conductive features) and one or more spark gap elements 252 (e.g., shaped conductive features). In some embodiments, such spark gap elements can be implemented on or near the surface of the substrate 102, on one or more conductor structures to elevate the spark gap elements from the substrate 102, or any combination thereof.

In the context of the spark gap elements 250, 252 being on conductor structures, the spark gap elements 250 can be implemented on a side of a conductor structure 258, and the spark gap elements 252 can be implemented on a side of a conductor structure 254. In some embodiments, some or all of the conductor structure 258 can be provided by a post 126 that supports a beam 124 of the first electrode 120. The conductor structure 254 can be formed underneath the beam 124 and adjacent the post 126 so as to allow the spark gap elements 252 to be positioned appropriately relative to the spark gap elements 250.

In such a configuration, the spark gap elements 250, 252 can remain generally fixed during the movements of the beam 124. Accordingly, spark gap elements 250, 252 can be configured to provide a preferred arcing path over an arcing path involving the contact pad 122, for some or all of the movement range of the beam 124.

In the example of FIG. 15, the spark gap elements 252 are shown to be electrically connected to the second electrode 130 through the conductive structure 254 and a conductive path 256. Accordingly, the discharge circuit 110 can be considered to provide a parallel and more preferred arcing path than the arcing path involving the contact pad 122. As described herein, the discharge circuit 110 can be connected in other manners to provide different routing options. For example, the spark gap elements 252 can be connected to ground.

Based on the various examples described herein, one can see that a discharge circuit can be implemented in a MEMS device so as to provide a preferred arcing path from any conductive feature associated with the first and/or second electrodes of an electromechanical assembly. Accordingly, such variations are contemplated in the present disclosure.

As also described herein, a discharge circuit can be implemented in a MEMS device by way of one or more conductive features that are separate from the first and/or second electrodes of an electromechanical assembly. Such conductive feature(s) of the discharge circuit may or may not be electrically coupled to the first and/or second electrodes. Accordingly, variations involving such configurations are contemplated in the present disclosure.

As also described herein, a discharge circuit can be based on one or more conductive features associated with an electromechanical assembly and one or more conductive features generally separate from the electromechanical assembly. Accordingly, variations involving such configurations are contemplated in the present disclosure.

In the various examples described herein, various spark gap configurations are described in the context of an air gap, and at locations above a substrate. However, it will be understood that spark gaps having one or more features as described herein can also be implemented such that some or all of the spark gap elements are within, for example, a substrate, a dielectric material, or any other material that provides electrical isolation between the elements.

In the various examples disclosed herein, various spark gap configurations are describe in the context of being implemented at various locations relative to an electromechanical assembly. It will be understood that a MEMS device can include more than one of such spark gaps at different locations to provide even more robust discharge protection for the MEMS device.

As described herein, at least some of the spark gap configurations of the various discharge circuits can be suitable for providing discharge protection during hot switching operations. Such a feature can be particularly advantageous, especially when one considers typical lifetime expectancies associated with hot-switching (e.g., about 100 million cycles) and cold-switching (e.g., about 5 billion cycles) operations.

In the various examples of FIGS. 3-15, the MEMS devices are described in the context of switching devices. It will be understood that other types of MEMS devices can also include a discharge circuit having or more features as described herein.

Figure 16:
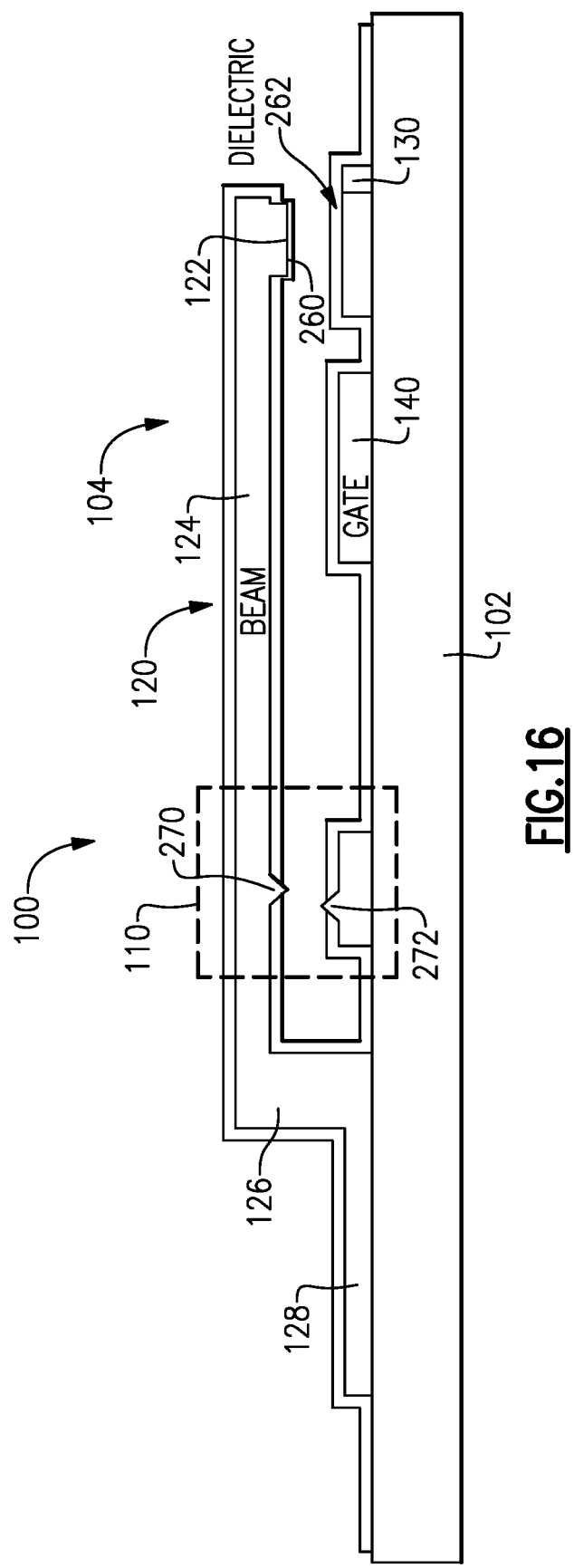
FIG. 16 shows a MEMS capacitor having a discharge circuit.

For example, FIG. 16 shows a MEMS capacitor 100 having a discharge circuit 110. In the example of FIG. 16, the MEMS capacitor 100 is shown to be similar to the switch example of FIGS. 9 and 10. A dielectric layer 260 is shown to be formed on the surface of a contact pad 122 of a first electrode 120. Similarly, a dielectric layer 262 is shown to be formed on the surface of a second electrode 130. Accordingly, when the beam is in its relaxed state (e.g., as in FIG. 16), a first capacitance exists between the first and second electrodes 120, 130. When the beam is in its flexed state due to the actuation by the gate 140, the dielectric layer 260 of the contact pad 122 comes into physical contact with the dielectric layer 262 of the second electrode 130 (but not in electrical contact) thereby yielding a second capacitance that is typically greater than the first capacitance. Values of the first and second capacitances can be adjusted by, for example, materials and/or thicknesses of the dielectrics 260, 262, and the separation gap when in the relaxed state.

In the example of FIG. 16, the discharge circuit 110 is shown to include one or more spark gap elements 270 (e.g., shaped conductive features) formed on the underside of the beam 124, and one or more spark gap elements 272 (e.g., shaped conductive features) formed on an upper surface of a conductor structure. The spark gap elements 270, 272 may or may not be completely covered by their respective dielectrics.

In some embodiments, the spark gap elements 270, 272 can be configured to add little or minimized capacitance between the elements, so as to not impact the capacitances associated with the first and second electrodes 120, 130. In some embodiments, the spark gap elements 270, 272 can be configured to contribute to the overall capacitances of the MEMS device in some desirable manner. In the context of switching devices as described herein, the spark gap elements can be configured to add little or minimized capacitance between the elements, so as to reduce or minimize parasitic capacitances associated with the switches.

In the example of FIG. 16, the spark gap elements 270, 272 are shown to be configured in a laterally offset manner similar to the example of FIGS. 9 and 10. Accordingly, the MEMS capacitor 100 can be switched between the two capacitance states while "hot," and have the discharge circuit 110 provide a preferred arcing path throughout such transitions.

It will be understood that MEMS capacitors can also be implemented with different discharge circuit configurations, including those examples described herein.

It will also be understood that, although various examples are described herein in the contexts of contact MEMS devices (such as contact switches) and capacitive MEMS devices, one or more features of the present disclosure can also be implemented in other MEMS applications and/or applications involving electromechanical devices. Such applications and/or devices can include, but are not limited to, gyroscopes, accelerometers, surface acoustic wave (SAW) devices, bulk acoustic wave (BAW) devices, and any other MEMS devices that are sensitive to ESD events and/or hot switching problems. In the context of contact switches, other RF and/or non-RF applications can include, for example, load switches in power supplies, voltage converters and regulators (e.g., where MEMS switches can replace FET switches); and power switches such as those configured to handle high power and/or high voltage (e.g., low frequency) signals.

MEMS devices having one or more features as described herein can be utilized in a number of electronic applications, including radio-frequency (RF) applications. In the context of RF applications, electrostatically-actuated MEMS devices, such as the MEMS switches and MEMS capacitors as described herein, can provide desirable characteristics such as low insertion loss, high isolation, high linearity, high power handling capability, and/or high Q factor.

Figure 17:
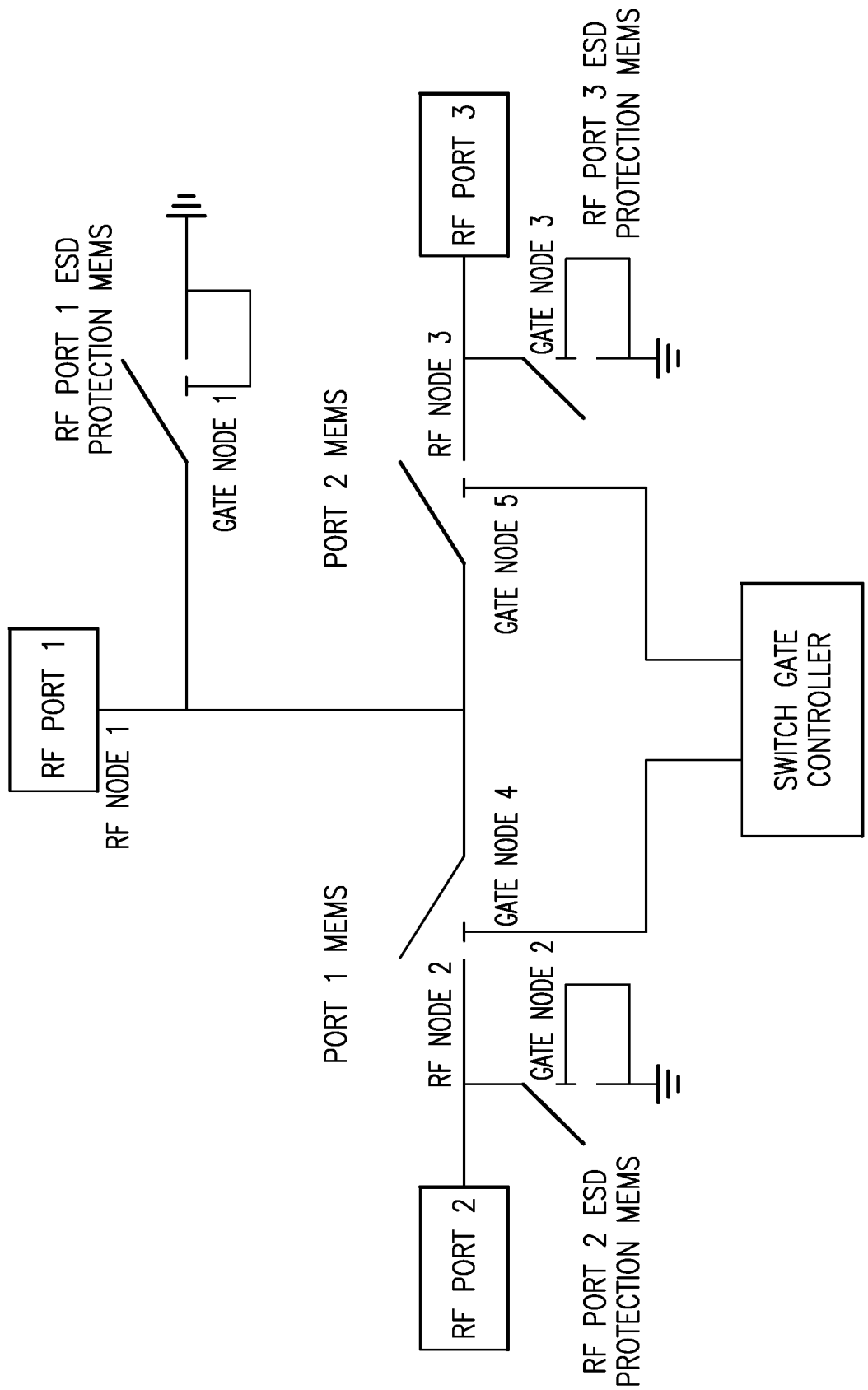
FIG. 17 shows an example of an RF application where MEMS devices having one or more features as described herein can be implemented.

FIG. 17 shows an example of an RF application where MEMS devices having one or more features as described herein can be implemented. The example of FIG. 17 includes a multiple port switching configuration involving RF Port 1, RF Port 2 and RF Port 3. RF Port 1 can be, for example, a common antenna port, and RF Ports 1 and 2 can be associated with, for example, first and second RF band signal paths. In such an example context, there can be more than two RF bands coupled to the common antenna port.

Each of the three ports is shown to be coupled to a switchable shunt path to ground. For RF Port 1, the shunt path can include an ESD protected MEMS switch. For RF Port 2, the shunt path can include an ESD protected MEMS switch. For RF Port 3, the shunt path can include an ESD protected MEMS switch. In some embodiments, each of such ESD protected MEMS switch can be configured as a self-actuating MEMS switch. Additional details concerning such self-actuating MEMS switches are described herein in greater detail.

In FIG. 17, a MEMS switch (Port 1 MEMS) can be provided between the second port (RF Port 2) and a common node shared by the three ports. Similarly, a MEMS switch (Port 2 MEMS) can be provided between the third port (RF Port 3) and the common node. Such MEMS switches (Port 1 MEMS and Port 2 MEMS) are shown to have their gates controlled by a switch gate controller.

In some embodiments, some or all of the foregoing MEMS devices (RF Port 1 ESD Protection MEMS, RF Port 2 ESD Protection MEMS, RF Port 3 ESD Protection MEMS, Port 1 MEMS, Port 2 MEMS) can include respective discharge circuits having one or more features as described herein. In the context of the self-actuating MEMS switches (e.g., RF Port 1 ESD Protection MEMS, RF Port 2 ESD Protection MEMS, RF Port 3 ESD Protection MEMS), spark gaps of their respective discharge circuits can be configured to facilitate and/or improve the self-actuating process.

With respect to self-actuation, it is noted that MEMS devices can self-actuate under certain conditions (e.g., higher voltage conditions). Such a property can be undesirable under some operating conditions; however, the same property can be utilized in other operating conditions to provide, for example, a switchable path to ground during ESD events.

In MEMS RF switch devices, such self-actuation can occur in beam-actuated configurations in which a beam is actuated by applying a voltage to the gate to thereby create an electrostatic force on the beam. In such a configuration, a beam can self-actuate, without the force from the gate, if there is a sufficient voltage difference between the beam and the gate.

During a typical ESD event, very high voltages can be applied to a MEMS device. In a MEMS device where the gate and one electrode are grounded, and the other electrode is located on the beam, such a high voltage associated with ESD can allow the beam to self-actuate and close the circuit between the two electrodes. This self-actuation allows the energy associated with the ESD event to be discharged to ground before other elements of the device are harmed. As described herein, use of discharge circuits in such self-actuated MEMS switches can allow the ESD Protection MEMS devices to be designed to actuate at a lower voltage and/or to have faster switching speeds.

In the example of FIG. 17, suppose there is an ESD event across any two ports. Such an ESD event will likely yield a large voltage differential between the beam and the gate of some or all of the ESD Protection MEMS devices. The affected ESD Protection MEMS device can have its beam self-actuated by the voltage differential; and since the affected gate is grounded, the ESD energy can safely dissipate to ground before damage occurs. Again, use of discharge circuits can allow such ESD Protection MEMS devices to be designed to actuate at a lower voltage and/or to have faster switching speeds to, for example, provide better protection of the rest of the devices (e.g., by activating before the rest of the device and thereby handling the discharge).

As disclosed herein, ESD Protection MEMS devices can be implemented as MEMS switches; and such MEMS switches may or may not include self-actuation functionality. As also disclosed herein, a discharge circuit having one or more features as described herein can be implemented in any of such MEMS devices, including but not limited to, a MEMS device (e.g., a switch) which may or may not be specifically configured to provide ESD protection, and a MEMS switch with or without self-actuation functionality.

Figure 18:
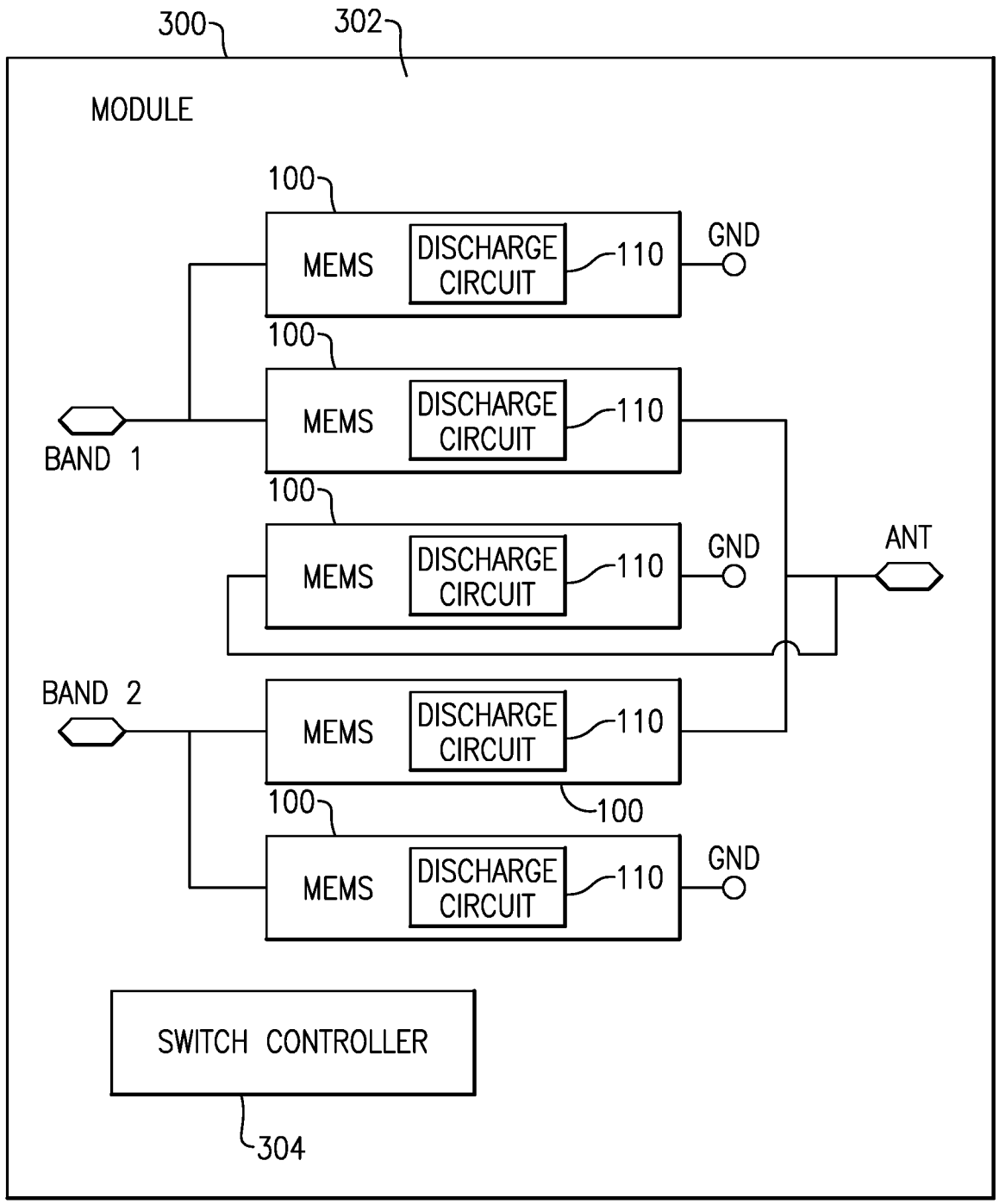
FIG. 18 shows that in some embodiments, one or more MEMS devices as described herein can be implemented in a module.

FIG. 18 shows that in some embodiments, one or more MEMS devices as described herein can be implemented in a module 300. The example module 300 can include a packaging substrate 302 configured to receive a plurality of components. At least some of such components can include one or more MEMS devices 100; and some or all of such MEMS devices can include a discharge circuit 110 having one or more features as described herein.

In the example of FIG. 18, five of such MEMS devices 100 are shown to be implemented on the substrate 302 and connected between three example ports to provide switching functionalities similar to the example of FIG. 17. In the example of FIG. 18, the antenna port (ANT) can be the first port (Port 1) of FIG. 17; and the ports for Band 1 and Band 2 can be the second and third ports (Port 2, Port 3) of FIG.

17. The five MEMS devices 100 can be mounted or formed on the substrate 302, and such devices can be interconnected to provide desired functionalities. In the example of FIG. 18, a switch controller component 304 is also depicted as being on the module 300. Other components can also be implemented on the module 300.

In some embodiments, the module 300 can be an antenna switching module (ASM). In some embodiments, the module 300 can be a front-end module (FEM) in which case other components such as power amplifiers, low-noise amplifiers, matching circuits, and/or duplexers/filters can be included.

In some implementations, an architecture, device and/or circuit having one or more features described herein can be included in an RF device such as a wireless device. Such an architecture, device and/or circuit can be implemented directly in the wireless device, in one or more modular forms as described herein, or in some combination thereof. In some embodiments, such a wireless device can include, for example, a cellular phone, a smart-phone, a hand-held wireless device with or without phone functionality, a wireless tablet, a wireless router, a wireless access point, a wireless base station, etc. Although described in the context of wireless devices, it will be understood that one or more features of the present disclosure can also be implemented in other RF systems such as base stations.

Figure 19:
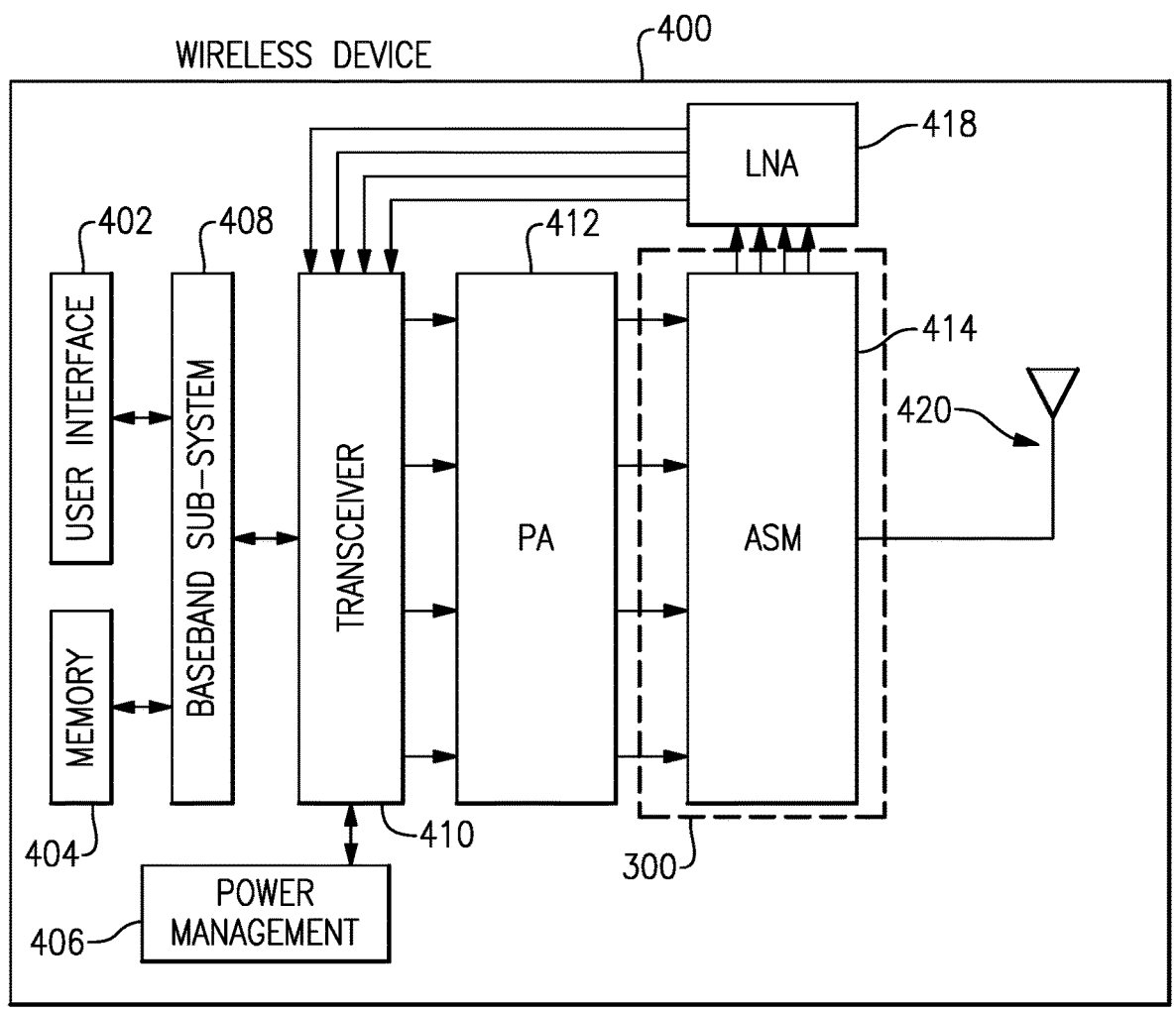
FIG. 19 depicts an example wireless device having one or more advantageous features as described herein.

FIG. 19 depicts an example wireless device 400 having one or more advantageous features described herein. In some embodiments, such advantageous features can be implemented in a module 300 such as an antenna switch module (ASM). In some embodiments, such a module can include more or less components than as indicated by the dashed box.

Power amplifiers (PAs) (collectively depicted as 412) (e.g., in a PA module) can receive their respective RF signals from a transceiver 410 that can be configured and operated to generate RF signals to be amplified and transmitted, and to process received signals. The transceiver 410 is shown to interact with a baseband sub-system 408 that is configured to provide conversion between data and/or voice signals suitable for a user and RF signals suitable for the transceiver 410. The transceiver 410 is also shown to be connected to a power management component 406 that is configured to manage power for the operation of the wireless device 400. Such power management can also control operations of the baseband sub-system 408 and other components of the wireless device 400.

The baseband sub-system 408 is shown to be connected to a user interface 402 to facilitate various input and output of voice and/or data provided to and received from the user. The baseband sub-system 408 can also be connected to a memory 404 that is configured to store data and/or instructions to facilitate the operation of the wireless device, and/or to provide storage of information for the user.

In the example wireless device 400, the module 300 can include one or more MEMS devices configured to provide one or more desirable functionalities as described herein. Such MEMS devices can facilitate, for example, operation of the antenna switch module (ASM) 414 in a discharge-protected manner. In some embodiments, at least some of the signals received through an antenna 420 can be routed from the ASM 414 to one or more low-noise amplifiers (LNAs) 418. Amplified signals from the LNAs 418 are shown to be routed to the transceiver 410.

A number of other wireless device configurations can utilize one or more features described herein. For example, a wireless device does not need to be a multi-band device.

In another example, a wireless device can include additional antennas such as diversity antenna, and additional connectivity features such as Wi-Fi, Bluetooth, and GPS.

In the various examples disclosed herein, discharge circuits are described as being configured to provide preferred discharge paths by way of, for example, arcing across opposing spark gap elements. It will be understood that use the term arcing or arc can include any transmission of energy such as electrical energy between two or more electrically non-contacting elements. Such transmission of energy can be due to, for example, ionization, and/or conduction; and can be through, for example, gas (including air), semiconductor, electrical insulator, and/or dielectric.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A switching device comprising:
a substrate;
a switching assembly implemented on the substrate and including a first electrode having a beam with a contact pad and a second electrode, the switching assembly configured to be in a first state in which the contact pad is disengaged from the second electrode or in a second state in which the contact pad is engaged with the second electrode, the switching assembly further configured to provide activation when a sufficient voltage difference exists between the beam and a gate, the activation resulting in the contact pad of the first electrode engaging the second electrode; and
a discharge circuit including a first spark element electrically connected with the first electrode and a second spark element electrically connected with the second electrode, the first and second spark elements arranged in a non-contacting manner with each other and configured such that an electrical discharge arc is directed between the first and second spark elements instead of being directed through the contact pad.

2. The switching device of claim 1 wherein the first spark element is implemented as a part of the beam of the first electrode.

3. The switching device of claim 2 wherein the first spark element is implemented on an underside of the beam, and the second spark element is oriented to face the first spark element.

4. The switching device of claim 3 wherein the second spark element is implemented on an upper surface of the second electrode.

5. The switching device of claim 2 wherein the first spark element is implemented on a side of the beam, and the second spark element is oriented to face the first spark element.

6. The switching device of claim 5 wherein the second spark element is implemented on a side of a conductor structure electrically connected to the second electrode.

7. The switching device of claim 1 wherein the first spark element includes one or more spark gap elements and the second spark element includes one or more spark gap elements.

8. The switching device of claim 7 wherein each of the one or more spark gap elements of the first and second conductors includes a shaped conductive feature.

9. The switching device of claim 8 wherein the one or more shaped conductive features of one of the first and second conductors is/are laterally offset from the one or more shaped conductive features of the other conductor.

10. The switching device of claim 1 wherein the first and second spark elements are configured such that the electrical discharge arc through the first and second spark elements occurs at a first potential difference between the first and second electrodes, the first potential difference being lower than a potential difference needed to trigger an electrical arc through the contact pad when the beam is in the first state.

11. The switching device of claim 10 wherein the first and second spark elements are further configured so that the first potential difference is lower than a lowest potential difference needed to trigger an electrical arc through the contact pad in a range of motion of the contact pad relative to the second electrode.

12. The switching device of claim 1 wherein the first and second spark elements are configured to provide discharge protection during hot switching operations as well as during cold switching operations involving the first and second electrodes.

13. The switching device of claim 1 wherein the gate is coupled to a ground such that the activation results in at least some of charge associated with the sufficient voltage difference between the beam and the gate to be dissipated to the ground.

14. The switching device of claim 1 wherein the switching device is implemented in a microelectromechanical systems (MEMS) format.

15. A packaged module comprising:
a packaging substrate configured to receive a plurality of components; and
a switching device implemented on the packaging substrate, the switching device including a switching assembly implemented on the substrate and including a first electrode having a beam with a contact pad and a second electrode, the switching assembly configured to be in a first state in which the contact pad is disengaged from the second electrode or in a second state in which the contact pad is engaged with the second electrode, the switching assembly further configured to provide activation when a sufficient voltage difference exists between the beam and a gate, the activation resulting in the contact pad of the first electrode engaging the second electrode, the switching device further including a discharge circuit having a first spark element electrically connected with the first electrode and a second spark element electrically connected with the second electrode, the first and second spark elements arranged in a non-contacting manner with each other and configured such that an electrical discharge arc is directed between the first and second spark elements instead of being directed through the contact pad.

16. The packaged module of claim 15 wherein the switching device is implemented in a microelectromechanical systems (MEMS) format.

17. The packaged module of claim 15 wherein the switching device is configured to be capable of providing radio-frequency switching functionality.

18. An electronic device comprising:
an integrated circuit for processing a signal; and
a switch circuit configured to support the processing of the signal, the switch circuit including a switching device having a switching assembly with a first electrode having a beam with a contact pad and a second electrode, the switching assembly configured to be in a first state in which the contact pad is disengaged from the second electrode or in a second state in which the contact pad is engaged with the second electrode, the switching assembly further configured to provide activation when a sufficient voltage difference exists between the beam and a gate, the activation resulting in the contact pad of the first electrode engaging the second electrode, the switching device further including a discharge circuit having a first spark element electrically connected with the first electrode and a second spark element electrically connected with the second electrode, the first and second spark elements arranged in a non-contacting manner with each other and configured such that an electrical discharge arc is directed between the first and second spark elements instead of being directed through the contact pad.

19. The electronic device of claim 18 further comprising an antenna configured to support either or both of receive and transmit operations.

20. The electronic device of claim 19 wherein the electronic device is a wireless device.

\* \* \* \* \*